(12) United States Patent
Salome et al.

(10) Patent No.: US 7,113,377 B2
(45) Date of Patent: Sep. 26, 2006

(54) ELECTROSTATIC DISCHARGE PROTECTION DEVICE COMPRISING SEVERAL THYRISTORS

(75) Inventors: Pascal Salome, Vif (FR); Stéphanie Dournelle, Grenoble (FR); Florence Azais, Combaillaux (FR); Benjamin Caillard, Montpellier (FR); Pascal Nouet, Combaillaux (FR)

(73) Assignees: Stmicrelectronics S.A., (FR); Centre National de la Recherche Scientifique, (FR)

( * ) Notice: Subject to any disclaimer, the term of this patent is extended or adjusted under 35 U.S.C. 154(b) by 571 days.

(21) Appl. No.: 10/419,707

(22) Filed: Apr. 17, 2003

(65) Prior Publication Data

US 2004/0021998 A1    Feb. 5, 2004

(30) Foreign Application Priority Data

Apr. 22, 2002   (FR) .................................. 02 05009

(51) Int. Cl.
*H02H 9/00*   (2006.01)

(52) U.S. Cl. ........................................................ 361/56
(58) Field of Classification Search .................. 361/56
See application file for complete search history.

(56) References Cited

U.S. PATENT DOCUMENTS

| 5,485,024 | A | | 1/1996 | Reay |
| 5,742,085 | A | | 4/1998 | Yu |
| 5,959,820 | A | * | 9/1999 | Ker et al. ..................... 361/111 |
| 6,055,143 | A | * | 4/2000 | Yu ................................ 361/56 |
| 6,594,132 | B1 | * | 7/2003 | Avery .......................... 361/111 |
| 6,803,633 | B1 | * | 10/2004 | Mergens et al. ............ 257/358 |
| 2002/0021538 | A1 | | 2/2002 | Chen et al. |

FOREIGN PATENT DOCUMENTS

EP          0027888        5/1981

OTHER PUBLICATIONS

Duvvury, et al., "A Synthesis of ESD Input Protection Scheme", Journal of Electrostatics, 29 (1992), pp. 1-19, no month.

* cited by examiner

*Primary Examiner*—Ronald Leja
(74) *Attorney, Agent, or Firm*—Jenkens & Gilchrist, P.C.

(57) ABSTRACT

An electrostatic discharge protection device comprises several thyristors which are connected in parallel between two nodes of an electrical circuit. It also includes a control circuit having an output connected to the control trigger terminal input of each of the thyristors. In response to an abnormal variation in a voltage between the two nodes being detected, the control circuit initiates a triggering current on the output so as to trigger the thyristors to conduct current between the two nodes. Preferably, the thyristors are arranged in a semiconductor substrate so as to have low hold voltages and small geometrical dimensions.

29 Claims, 2 Drawing Sheets

ELECTROSTATIC DISCHARGE PROTECTION DEVICE COMPRISING SEVERAL THYRISTORS

CROSS-REFERENCE

The present application claims foreign priority from French Patent Application Number 02 05009 filed Apr. 22, 2002, the disclosure of which is hereby incorporated by reference.

BACKGROUND OF THE INVENTION

1. Technical Field of the Invention

The present invention relates to devices for protecting integrated electrical circuits against electrostatic discharges. It relates more particularly to such protection devices comprising several thyristors or, equivalently, one thyristor produced in segmented ("multi-finger") form. For the case in question, that of protecting integrated electrical circuits, the protection device is incorporated into the same substrate as the protected circuit.

2. Description of Related Art

Many electrical circuits, depending on their use, their sensitivity or their installation, need to be protected from being damaged by possible electrostatic discharges. Such discharges are caused, for example, by an operator touching part of an electrical circuit without taking particular precaution.

The document entitled "A synthesis of ESD input protection scheme" by Ch. Duvvury and R. Rountree, Journal of Electrostatics, 29 (1992), pp 1–19, describes various designs of electrostatic discharge protection devices. Some of these devices use the avalanche effect of an electrical junction placed in a semiconductor substrate or the snapback effect of an MOS transistor to open a pathway for draining away the electrical charges of an electrostatic discharge. Moreover, this draining pathway commonly comprises a thyristor or silicon-controlled rectifier (SCR).

A drawback of this type of electrostatic protection based on avalanche or snapback effects is due to the fact that the thresholds at which these effects appear depend on the densities of the electrical dopings produced. Such protection means become inefficient when these thresholds are too high in relation to certain characteristics of the electrical circuits to be protected. Various improvements to these protection means have been proposed, but they result in complex combinations of electronic components.

In addition, some electrostatic discharges may correspond to particularly large quantities of electric charges, such that a single drain pathway may be insufficient to provide effective protection of the electrical circuit.

SUMMARY OF THE INVENTION

To address the foregoing drawbacks, an electrostatic discharge protection device is provided which has in particular several pathways for draining the electric charges.

According to an aspect of the invention, an electrostatic discharge protection device comprises several thyristors and a control circuit which are connected in parallel between two nodes of an electrical circuit. The control circuit has an output connected to the trigger of each of the thyristors. The control circuit functions to detect an abnormal variation in the voltage between said nodes and responds by causing a triggering current to flow in said output so as to trigger the thyristors.

In the context of the present invention, the expression "several thyristors connected in parallel" is understood to mean both separate individual thyristors thus connected and a single multi-finger thyristor (or multi-finger SCR) known to those skilled in the art. Such a multi-finger thyristor has several triggers and is electrically equivalent to as many individual thyristors placed in parallel as there are triggers.

In the context of the present invention, the expression "abnormal variation in the voltage between said nodes" is understood to mean a variation in this voltage that does not result from a change in an electrical signal in accordance with the function of said electrical circuit. An electrostatic discharge on one of the two nodes is a non-limiting example of such an abnormal variation.

An advantage of the configuration and operation of the present invention lies in the simultaneity of the triggerings of all of the thyristors of the protection device, thereby guaranteeing maximum effectiveness of the protection thus provided.

Another advantage of the present invention lies in the possibility of using thyristors which each have a limited conduction capability and which consequently have small dimensions more easily compatible with the processes used for fabricating the devices in which they will be incorporated.

In one particular embodiment of the invention, the triggering function of the control circuit is implemented with a triggering transistor having a control input connected to an output of the detection function, a first electrode connected to the output of the control circuit, and a second electrode connected to a first of said nodes. With this embodiment, the current for triggering the thyristors is not directly an avalanche current in a junction or a snapback current of a transistor.

Preferably, said first electrode of the triggering transistor is connected to the output of the control circuit via a resistor. This resistor partially isolates the control circuit from the thyristors, in such a way that the flow of electric charges intended to be drained away is partly limited to the thyristors. Thus, the control circuit itself is protected against possible damage caused by particularly large electrostatic discharge currents.

Optionally, the triggering function may furthermore include a stabilizing transistor having a control input connected to the output of the detection function, a first electrode connected to a second of said nodes, and a second electrode connected to the output of the control circuit.

The detection function of the control circuit may be implemented in any one of a variety of ways, adapted according to the electrical circuit intended to be protected. This circuit may be directly placed at the output of an electrical voltage supply, or it may be an input/output cell present, for example, at the interface between a signal transfer bus and a device for receiving and/or transmitting these signals.

In a preferred embodiment of the invention, each thyristor has a configuration particularly adapted for an electrostatic protection device. According to this embodiment, each thyristor comprises two contiguous doping wells, an n-doping well and a p-doping well respectively, which are formed in a substrate of semiconductor material. A cathode-forming n-doping region lies within the p-doping well without any contact with the interface between the two wells. At least one anode-forming p-doping region lies within the n-doping well without any contact with the interface between the two wells. The thyristor further includes at least one trigger-forming n-doping region lying within the n-doping well without any contact with the interface between the two wells or with the anode or cathode regions. The trigger-forming n-doping region has a doping density greater than the doping density of the n-doping well.

Thyristors having such a configuration may have very small, especially submicron, geometrical dimensions.

Another advantage of the thyristors having such a configuration lies in the fact that they may have a particularly low hold voltage, owing to the closeness between the anode and cathode regions. Thus, a prolonged draining of electrostatic charges can be obtained, contributing to the effectiveness of the protection device. In addition, the flow of the electrostatic charge current through such thyristors causes them to heat up very little.

The invention also relates to an integrated circuit comprising an electrical circuit to be protected and an electrostatic discharge protection device as described above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
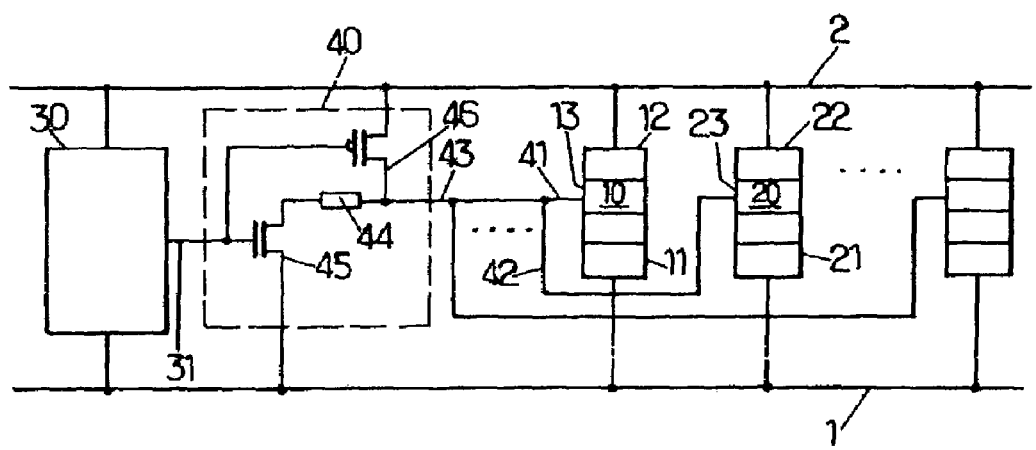
FIG. 1 is a circuit diagram of a protection device according to the invention.

FIG. 1 shows an electrostatic discharge protection device placed between two nodes 1 and 2 of an electrical circuit (not shown). The nodes 1 and 2 may be the output terminals of an electrical voltage supply, for example a DC supply, the node 1 being the negative terminal and the node 2 being the positive terminal. They may also be two tracks of a binary-signal transport bus, the node 1 being connected to a reference track and the node 2 being connected to a track carrying a signal corresponding to a positive or zero voltage with respect to the reference track. The foregoing present examples only and are not intended to be limiting or restricting of the application of the present invention.

At least two SCRs (thyristors) 10, 20 are connected by their respective cathodes 11, 21 to the node 1 and by their respective anodes 12, 22 to the node 2.

The respective control terminal triggers 13, 23 of the SCRs 10, 20 are connected to the output 43 of the triggering circuit 40 by respective electrical connections 41, 42. The output 43 is supplied with current under the control of triggering circuit 40 comprising an n-MOS transistor 45 and a p-MOS transistor 46. The n-MOS transistor has a gate connected to an output 31 of an electrostatic discharge detection circuit 30, a drain connected to the output 43 via a resistor 44, and a source connected to the node 1. The resistor 44 may be made of polysilicon and have, for example, a value of about 50 ohms.

In normal operation, the voltage between the output 31 of the detection circuit 30 and the node 1 is zero. The transistor 45 is then off, so that no electrical current is extracted from the triggers 13, 23 by the connections 41, 42. The SCRs 10, 20 are therefore off.

Figure 2A:
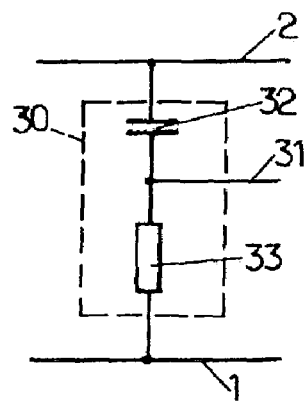
FIGS. 2a and 2b are circuit diagrams of two detection circuits that can be used in the protection device of FIG. 1.

In FIG. 2a, the detection circuit 30 comprises, for example, a capacitor 32, connected between the node 2 and the output 31, and a resistor 33, for example a 1 kilo-ohm resistor, connected between the output 31 and the node 1. The capacitor 32 may have a very low capacitance, and consist especially of a p-MOS transistor whose source and drain are connected to the node 2 and whose gate is connected to the output 31. Such a detection circuit is in particular suitable as a protection device placed at the output of a DC electrical voltage supply.

When a sudden increase in the voltage between the nodes 1 and 2 occurs, caused by an electrical discharge, the voltage between the output 31 and the node 1 suddenly rises, by continuity of the electric charge of the capacitor 32. This rise in the voltage between the output 31 and the node 1 turns the n-MOS transistor 45 on. An instantaneous current then flows from the node 2 to the node 1, passing via the respective anodes 12, 22 of the SCRs, their respective triggers 13, 23, the resistor 44 and the n-MOS transistor 45. This instantaneous current then triggers the SCRs 10, 20 which become conducting, in a manner known per se, between their respective anodes and their respective cathodes. The electrostatic charges therefore flow away, in a second step, from the node 2 to the node 1, passing mainly through the SCRs 10, 20 by virtue of the resistor 44 which limits the intensity of the current through the n-MOS transistor 45.

By limiting the intensity of the current passing through the n-MOS transistor 45 in this way, it is possible to dispense with the precautions usually taken in order to guarantee good distribution of the electrical current over the surface of the contacts of transistors with a high conduction capability. In particular, the contact of the connection coming from the resistor 44 to the drain of the n-MOS transistor 45 may not include a mask for distributing the current over this electrode, despite the use of a silicide (titanium silicide, cobalt silicide, etc.) as contact material. The entire electrostatic protection device may even benefit from this simplification in the production of the electrode contact surfaces, thereby further contributing to reducing the manufacturing cost of the device.

A stabilizing p-MOS transistor 46 is added to the triggering circuit 40. This transistor 46 has a gate connected to the output 31 of the detection circuit 30, a drain connected to the node 2, and a source connected to the output 3 of the control means. In normal operation, the p-MOS transistor 46 is in the on state. It ensures that there is a low electrical resistance between the node 2 and the triggers 13, 23 of the SCRs 10, 20 connected to the output 43. Thus, a moderate rise in the voltage between the nodes 1 and 2, due to normal operation of the devices connected to the nodes 1 and 2, does not cause the SCRs 10, 20 to trigger. These SCRs 10, 20 are triggered only for variations in the voltage between the nodes 1 and 2 that are large enough compared with the conduction capability of the p-MOS transistor 46. This precaution therefore avoids inopportune triggering of the SCRs 10, 20, especially caused by normal operating signals reaching the nodes 1 and 2, or by whatever low-amplitude parasitic noise that might affect the electrical voltage between the nodes 1 and 2.

Figure 2B:
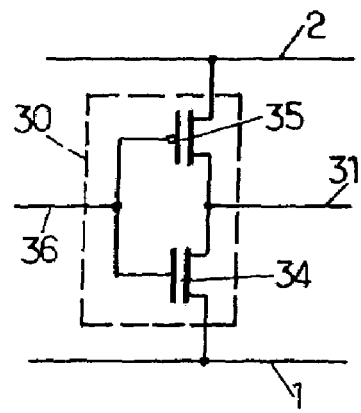

FIG. 2b illustrates another embodiment of the detection circuit 30, more particularly adapted for a device intended for protecting an input/output cell, or interface cell, placed between a databus and a peripheral circuit. The electrical voltage of the node 2 relative to the node 1 is assumed to be positive. According to this embodiment, the detection circuit 30 includes an inverting circuit. One input 36 of this inverting circuit is connected, for example, to a positive electrical voltage source, which may also serve for supplying the peripheral circuit.

Such an inverting circuit comprises, for example, according to FIG. 2b, an n-MOS transistor 34 and a p-MOS transistor 35 having their respective gates connected together and to the input 36 of the detection circuit 30. The drain of the p-MOS transistor 35 is connected to the node 2, the source of the n-MOS transistor 34 is connected to the node 1, and the source of the p-MOS transistor 35 is connected to the drain of the n-MOS transistor 34 and to the output 31 of the detection circuit.

In normal operation, the voltage between the output 31 of the detection circuit 30 and the node 1 is zero. The n-MOS transistor 45 is off, as are the SCRs 10, 20.

The protection thus achieved is active when the protected circuit is being handled before it is finally installed, for example before it is connected to the nodes 1 and 2. The input 36 is therefore not yet connected to the electrical voltage source, and the electrical voltage between the input 36 and the node 1 is zero. When the voltage between the nodes 1 and 2 caused by an electrostatic discharge rises, the voltage between the output 31 and the node 1 also rises, because of the behavior of the inverting circuit. The operation of the protection device then continues in the manner described above.

Figure 3:
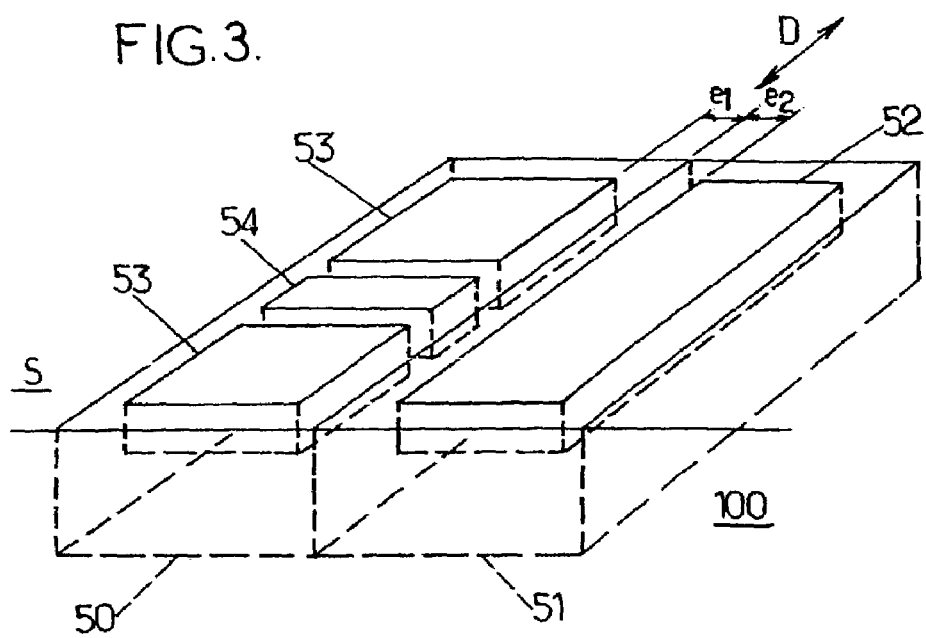
FIG. 3 shows an SCR structure according to the preferred embodiment of the invention.

FIG. 3 corresponds to a preferred embodiment of the invention, wherein each SCR is formed by an n-doped well 50 and a p-doped well 51, these being for example rectangular parallelepipeds of the same dimensions, formed in the surface S of a planar silicon substrate 100. These two wells 50 and 51 lie parallel with the surface S over a great length of these wells. They are contiguous via one of the faces of the parallelepiped of each well 50, 51, said face lying perpendicular to the surface S of the substrate 100. D denotes the direction of the interface between the two wells 50 and 51 in the plane of the surface S.

The cathode of the SCR consists of an n-doping region 52 lying level with the surface S, in a central part of that face of the p-doping well 51 carried by the surface S. It has, for example, in the plane of the surface S, the shape of a rectangle whose sides are parallel to those of that face of the well 51 which is carried by the surface S, and lie at a distance $e_2$ from them, within this face. In the configuration depicted, the cathode region 52 has therefore such a distance $e_2$ from the interface between the two wells 50 and 51.

The anode comprises two p-doping regions 53 formed in the n-doping well 50 level with that face of the latter which is carried by the surface S. Each of these anode regions 53 is rectangular in the plane of the surface S and lies level with the two ends of said face of the well 50 along the direction D. Each region 53 has one side parallel to the direction D and lying at a distance $e_1$ from the interface between the two wells 50 and 51. The two anode regions 53 are connected together by an electrical connection (not shown).

The trigger of the SCR comprises an n-doping region 54 formed level with the surface S, around the center of that face of the well 50 which is carried by the surface S, between the two anode regions 53. The doping density of this trigger region 54 is greater than the doping density of the n-doping well 50. This trigger region 54 is, for example, also rectangular in the plane of the surface S, with sides lying respectively at a distance $e_1$ from the sides of said face of the well 50 or from one of the sides of the anode regions 53.

Thus, the anode regions 53 and the trigger region 54 are placed on the same face of the n-doping well 50, being aligned and mutually alternating along the direction D. In this configuration, the cathode region 52 is separated from each anode region 53 by the distance $e_1+e_2$. This distance $e_1+e_2$ may be reduced to the minimum in relation to the spacing rules imposed by the photolithography processes used to form the SCR.

Optionally, a larger number of anode regions and trigger regions may be placed on the surface of the n-doping well 50. Advantageously, they are aligned along the direction D and are mutually alternating, one trigger region lying between two successive anode regions. Anode regions are placed at the two ends of the alignment. All the trigger regions are connected together by external electrical connections, and the anode regions are connected together likewise.

Such a multiplicity of trigger regions and anode regions provides a more homogeneous distribution, along the direction D, of the electrical current flowing through the SCR. In addition, such an SCR switches more rapidly between its off state and its on state.

Such an SCR may have a particularly low hold voltage, by virtue of the short distance between the anode regions 53 and the cathode region 52. This is because such a distance limits the drop in ohmic voltage caused by the flow of an electrical current between the anode and the cathode of the SCR. The hold voltage may thus be less than 2 volts and may especially be around 1 volt. By the same token, the generation of heat by the Joule effect, caused by the flow of such an electrical current, is also limited.

Figure 4:
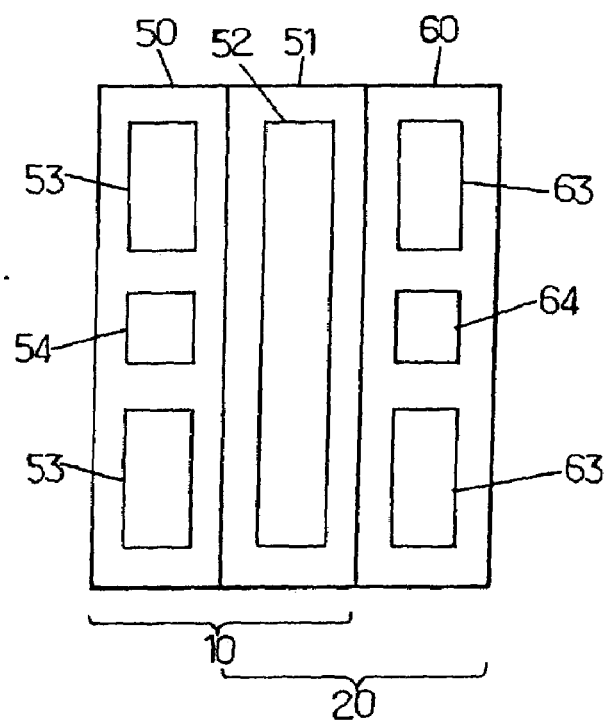
FIG. 4 shows an arrangement of two SCRs in accordance with the structure of FIG. 3.

FIG. 4 illustrates a particularly compact configuration of two SCRs, like those described above, connected in parallel via their cathodes. According to this configuration, two such SCRs 10, 20 share the same p-doping well 51 and the same cathode region 52 lying within this well 51. The two SCRs have separate respective n-doping wells 50, 60, separate respective anode regions 53, 63, and separate respective trigger regions 54, 64.

This compact configuration may be extended further by creating, in the substrate 100, an alternation of n and p-doping wells, with n-doping wells at two ends of this alternation. The p-doping wells have cathode regions similar to that described above. Likewise, the n-doping wells have anode regions and trigger regions similar to those described above. Such a configuration makes it possible for the level of integration, that is to say the concentration of SCRs formed in the semiconductor substrate, to be even higher, this being combined with a very high electrical conduction capability of the SCR assembly thus formed.

Evaluation tests have been carried out on an electrostatic protection device according to the preferred embodiment of the invention. The device used for these tests consisted of two SCRs twinned by their p-doping well 51 and by their cathode 52, as shown in FIG. 4. The length of this cathode 52 along the direction D was 35 micrometers. The MOS transistors were produced in 0.18 micron gate-width technology, without the use of a mask for distributing the current over the electrodes of these transistors. Effective protection against discharges of over 8000 volts according to the HBM (Human Body Model) standard was observed, with neither failure nor deterioration of the protection device.

Tests were also carried out on an electrostatic protection device comprising four SCRs produced as a succession of five contiguous doping wells, with a capacitor/resistor protection circuit 30 like that shown in FIG. 2a. Electrical measurements and light emission measurements showed that the four SCRs were actually triggered simultaneously, and contributed equally among them to draining off the electric charges of discharges corresponding to various voltages.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. Electrostatic discharge protection device comprising several thyristors anode/cathode connected in parallel between two nodes of an electrical circuit and a control circuit also connected in parallel between the two nodes of the electrical circuit, the control circuit having an output connected to a non-anode/cathode trigger terminal of each of the thyristors, wherein the control circuit includes a detection circuit to detect an abnormal variation in the voltage between the two nodes, and a triggering circuit that causes a triggering current to flow in the output of the control circuit in response to a detected abnormal voltage variation so as to trigger the several thyristors.

2. The device according to claim 1, wherein the triggering circuit comprises a triggering transistor having a control input connected to an output of the detection circuit, a first electrode connected to the output of the control circuit, and a second electrode connected to a first one of the two nodes.

3. The device according to claim 2, wherein the first electrode of the triggering transistor is connected to the output of the control circuit via a resistor.

4. The device according to claim 2, wherein the triggering transistor is an n-MOS transistor having a gate connected to the output of the detection circuit, a drain connected to the output of the control circuit, and a source connected to respective cathodes of the several thyristors.

5. The device according to claim 2, wherein the triggering circuit further includes a stabilizing transistor having a control input connected to the output of the detection circuit, a first electrode connected to a second of the two nodes, and a second electrode connected to the output of the control circuit.

6. The device according to claim 4, wherein the triggering circuit further includes a stabilizing transistor having a control input connected to the output of the detection circuit, a first electrode connected to a second of the two nodes, and a second electrode connected to the output of the control circuit, and wherein the stabilizing transistor is a p-MOS transistor having a gate connected to the output of the detection circuit, a drain connected to respective anodes of the several thyristors, and a source connected to the output of the control circuit.

7. The device according to claim 1, wherein the detection circuit comprises a capacitor connected between one of the two nodes and the output of the detection circuit, and a resistor connected between the output of the detection circuit and the other of the two nodes.

8. The device according to claim 1, wherein the detection circuit comprises an inverting circuit.

9. The device according to claim 8, wherein the detection circuit comprises an n-MOS transistor and a p-MOS transistor having two respective gates connected to each other and to an input of the detection circuit, respective sources and drains, the drain of the p-MOS transistor being connected to one of the two nodes, the source of the n-MOS transistor being connected to the other of the two nodes, the source of the p-MOS transistor and the drain of the n-MOS transistor being connected together and to the output of the detection circuit.

10. The device according to claim 1, wherein the several thyristors and the control circuit are produced in a semiconductor integrated circuit incorporating at least part of the electrical circuit.

11. The device according to claim 1, wherein each thyristor comprises two contiguous doping wells, an n-doping well and a p-doping well respectively, which are formed in a substrate of semiconductor material, a cathode-forming n-doping region lying within the p-doping well without any contact with the interface between the two wells, at least one anode-forming p-doping region lying within the n-doping well without any contact with the interface between the two wells, at least one trigger-forming n-doping region lying within the n-doping well without any contact with the interface between the two wells or with the anode or cathode regions, the trigger-forming n-doping region having a doping density greater than the doping density of the n-doping well.

12. The device according to claim 11, wherein the anode region or regions and the trigger region or regions are aligned and are mutually alternating along a direction parallel to the interface between the two wells.

13. The device according to claim 12, wherein the aligned anode region or regions and the trigger region or regions have respective sides approximately parallel to the interface between the two wells.

14. The device according to claim 13, wherein the cathode region has a side approximately parallel to the direction of alignment of the anode and trigger regions.

15. The device according to claim 11, comprising two thyristors sharing the same p-doping well and the same cathode region lying within the p-doping well, and having separate respective n-doping wells, separate respective anode regions and separate respective trigger regions.

16. An integrated circuit, including an electrical circuit to be protected and an electrostatic discharge protection device, the electrostatic discharge protection device comprising several thyristors anode/cathode connected in parallel between two nodes of the electrical circuit and control means also connected in parallel between the two nodes of the electrical circuit, the control means having an output connected to a non-anode/cathode trigger terminal of each of the several thyristors, wherein the control means comprise detection means for detecting an abnormal variation in the voltage between the two nodes, and triggering means designed to cause a triggering current to flow into the output of the control means in response to a detected abnormal voltage variation so as to trigger the several thyristors.

17. An electrostatic discharge protection device, comprising:
 a first SCR having its cathode connected to a first node and its anode connected to a second node, the first SCR further having a first non-anode/cathode control terminal;
 a second SCR having its cathode connected to the first node and its anode connected to the second node, the second SCR further having a second non-anode/cathode control terminal;
 a first circuit connected between the first and second nodes and operable to detect an abnormal variation in voltage between the first and second nodes; and
 a second circuit connected between the first circuit and the first and second control terminals, the second circuit operating responsive to first circuit detection by generating a triggering current for application to the first and second non-anode/cathode control terminals.

18. The device of claim 17 wherein the abnormal variation in voltage comprises an electrostatic discharge applied to either of the first or second nodes.

19. The device of claim 17 further including additional SCRs with each cathode connected to the first node, with each anode connected to the second node, and with their control terminals connected to receive the triggering current.

20. The device of claim 17 wherein the device is fabricated on an integrated circuit chip along with circuitry to be protected by the device against electrostatic discharge.

21. The device of claim 20 wherein each SCR comprises:
an n-doping well;
a p-doping well;
a cathode-forming n-doping region lying within the p-doping well;
an anode-forming p-doping region lying within the n-doping well;
a control terminal-forming n-doping region lying within the n-doping well having a doping density greater than the doping density of the n-doping well.

22. The device according to claim 21, wherein at least two of the SCRs share a common p-doping well and a common cathode forming region lying within that common p-doping well, and have separate respective n-doping wells, separate respective anode forming regions and separate respective control terminal regions.

23. The device as in claim 17 wherein the second circuit comprises:
a first transistor having a control terminal connected to the first circuit, a first controllable path terminal connected to one of the first and second nodes, and a second controllable path terminal; and
a resistor connected between the second controllable path terminal and the control terminal of each included SCR.

24. The device as in claim 23 wherein the second circuit further comprises a second transistor having a control terminal connected to the first circuit, a first controllable path terminal connected to one of the first and second nodes, and a second controllable path terminal connected to the control terminal of each included SCR.

25. The device as in claim 17 wherein the first and second SCRs are represented by fingers within an integrated multi-finger SCR device.

26. A semiconductor thyristor configuration, comprising:
two contiguous doping wells, an n-doping well and a p-doping well respectively, which are formed in a substrate of semiconductor material;
a cathode-forming n-doping region lying within the p-doping well without any contact with the interface between the two wells;
at least one anode-forming p-doping region lying within the n-doping well without any contact with the interface between the two wells;
at least one trigger-forming n-doping region lying within the n-doping well without any contact with the interface between the two wells or with the anode or cathode regions, the trigger-forming n-doping region having a doping density greater than the doping density of the n-doping well;
wherein the anode region or regions and the trigger region or regions are aligned and are mutually alternating along a direction parallel to the interface between the two wells.

27. The structure according to claim 26, wherein the aligned anode region or regions and the trigger region or regions have respective sides approximately parallel to the interface between the two wells.

28. The structure according to claim 27, wherein the cathode region has a side approximately parallel to the direction of alignment of the anode and trigger regions.

29. A semiconductor thyristor configuration, comprising:
two contiguous doping wells, an n-doping well and a p-doping well respectively, which are formed in a substrate of semiconductor material;
a cathode-forming n-doping region lying within the p-doping well without any contact with the interface between the two wells;
at least one anode-forming p-doping region lying within the n-doping well without any contact with the interface between the two wells;
at least one trigger-forming n-doping region lying within the n-doping well without any contact with the interface between the two wells or with the anode or cathode regions, the trigger-forming n-doping region having a doping density greater than the doping density of the n-doping well;
wherein two thyristors share the same p-doping well and the same cathode region lying within the p-doping well, and have separate respective n-doping wells, separate respective anode regions and separate respective trigger regions.

* * * * *